(12) United States Patent
Morizuka (10) Patent No.: US 9,865,724 B1
(45) Date of Patent: Jan. 9, 2018

(54) NITRIDE SEMICONDUCTOR DEVICE (71) Applicant: Kabushiki Kaisha Toshiba, Minato-ku (JP)

(72) Inventor: Mayumi Morizuka, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/455,918

(22) Filed: Mar. 10, 2017

(30) Foreign Application Priority Data

Aug. 9, 2016 (JP) .................. 2016-156673

(51) Int. Cl.
  H01L 29/00 (2006.01)
  H01L 29/778 (2006.01)
  H01L 29/20 (2006.01)
  H01L 29/40 (2006.01)
  H01L 29/205 (2006.01)
  H01L 29/66 (2006.01)
  H01L 29/417 (2006.01)

(52) U.S. Cl.
  CPC ...... H01L 29/7787 (2013.01); H01L 29/2003 (2013.01); H01L 29/205 (2013.01); H01L 29/404 (2013.01); H01L 29/41775 (2013.01); H01L 29/66462 (2013.01)

(58) Field of Classification Search
  None
  See application file for complete search history.

(56) References Cited

U.S. PATENT DOCUMENTS

| 2007/0114569 A1 | 5/2007 | Wu et al. |
| 2007/0224710 A1 | 9/2007 | Palacios et al. |
| 2009/0200576 A1 | 8/2009 | Saito et al. |
| 2010/0283083 A1 | 11/2010 | Niiyama et al. |
| 2014/0091364 A1 | 4/2014 | Imanishi et al. |

FOREIGN PATENT DOCUMENTS

| JP | 2004-273486 | 9/2004 |
| JP | 2007-335677 | 12/2007 |
| JP | 2009-507396 | 2/2009 |
| JP | 2009-218566 | 9/2009 |
| JP | 2010-109086 | 5/2010 |
| JP | 2014-72397 | 4/2014 |

OTHER PUBLICATIONS

J. Osvald et al. "C-V characterization of $SF_6$ plasma treated AlGaN/GaN heterostructures," Microelectronic Engineering 87, 10.1016/j.mee.2010.02.004, 2010, pp. 3.

Primary Examiner — Reema Patel
(74) Attorney, Agent, or Firm — Oblon, McClelland, Maier & Neustadt, L.L.P.

(57) ABSTRACT

A nitride semiconductor device includes a first semiconductor layer, a second semiconductor layer, a third semiconductor layer including a nitride semiconductor provided between the first semiconductor layer and the second semiconductor layer, the third semiconductor layer being contact with the first semiconductor layer and the second semiconductor layer, and a concentration of acceptor type impurity in the third semiconductor layer is higher than that in the first semiconductor layer and the second semiconductor layer, and including a source electrode and a drain electrode, a gate electrode, a first insulating layer, and a fourth semiconductor layer and a fifth semiconductor layer, wherein the nitride semiconductor device satisfying the following formula $0<d<2[(2\in E_g)/(qN_a)]^{1/2}$.

18 Claims, 5 Drawing Sheets

NITRIDE SEMICONDUCTOR DEVICE

CROSS-REFERENCE TO RELATED APPLICATIONS

This application is based upon and claims the benefit of priority from Japanese Patent Application No. 2016-156673, filed on Aug. 9, 2016, the entire contents of which are incorporated herein by reference.

FIELD

Embodiments described herein relate generally to a nitride semiconductor device.

BACKGROUND

Power semiconductor devices are used for switching circuits and inverter circuits for power control.

A power semiconductor device needs to have a high breakdown voltage and a low on-resistance, but limits of the breakdown voltage and on-resistance of a power semiconductor device using silicon (Si) based on physical properties of Si are being reached.

On the other hand, a nitride semiconductor has a wider band gap than Si so that a semiconductor device using a nitride semiconductor can implement properties combining a lower on resistance and a higher breakdown voltage more easily than a semiconductor device using silicon.

Field effect transistors (FET) using a nitride semiconductor are grouped into a normally-on type and a normally-off type. Normally-off type FETs have an advantage of a small number of components when a power control circuit is constructed, but have problems such as a slower switching speed, an increased on-resistance, and further difficulty of implementing a desired threshold voltage within a normally-off range.

DETAILED DESCRIPTION

Hereinafter, the embodiments will be described with reference to the drawings.

Components having the same reference sign attached show similar components. Incidentally, the drawings are schematic or conceptual, and the relation between the thickness and width of each portion, a specific coefficient of size between portions and the like are not necessarily the same as those in reality. In addition, even if the same portion is represented, mutual dimensions or specific coefficients may be represented differently depending on the drawings.

In this specification, to show the physical relationship between components, the upward direction of a drawing is described as "up" and the downward direction of a drawing is described as "down." In this specification, the concepts of "up" and "down" are not necessarily terms showing a relation with respect to the direction of gravity.

In this specification, a "GaN based semiconductor" is a generic name for semiconductors including gallium nitride (GaN), aluminum nitride (AlN), indium nitride (InN), or intermediate compositions thereof.

First Embodiment

Figure 1:
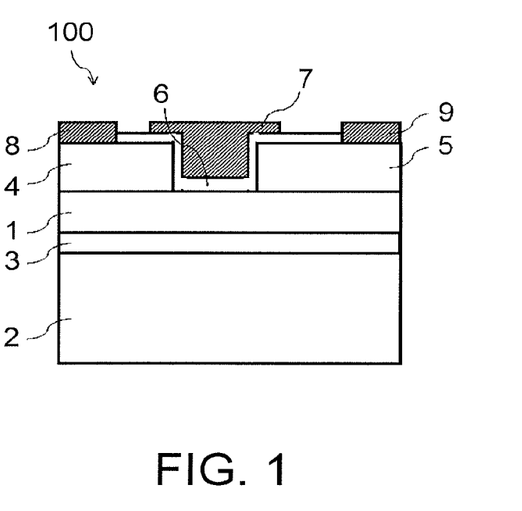
FIG. 1 is a schematic sectional view of a nitride semiconductor device according to a first embodiment.

A sectional view of a nitride semiconductor device is shown in FIG. 1.

A nitride semiconductor device 100 is a field effect transistor (FET) formed of a GaN based semiconductor.

The nitride semiconductor device 100 includes a first semiconductor layer 1, a second semiconductor layer 2, a third semiconductor layer 3, a fourth semiconductor layer 4, a fifth semiconductor layer 5, a first insulating layer 6, a gate electrode 7, a source electrode 8, and a drain electrode 9.

The first semiconductor layer 1 and the second semiconductor layer 2 are made of gallium nitride (GaN).

The third semiconductor layer 3 is provided between the first semiconductor layer 1 and the second semiconductor layer 2 so as to be in contact with each of the semiconductor layers. The third semiconductor layer 3 is made of gallium nitride (GaN). GaN of the third semiconductor layer 3 contains acceptor type impurities.

The first semiconductor layer 1 and the second semiconductor layer 2 are undoped layers.

In this specification, the undoped layer may contain an unintended acceptor type impurity or donor type impurity in each manufacturing stage. The acceptor type impurity or donor type impurity is an element contained in a source gas, an element contained in a carrier gas, a constituent element of a substrate or the like. Also, an acceptor or donor originating from crystal defects may be contained.

An acceptor impurity contained in GaN of the third semiconductor layer 3 is intentionally introduced in a manufacturing step. The concentration of an acceptor contained in GaN of the third semiconductor layer 3 is higher than that of an acceptor contained in GaN of the first semiconductor layer 1 and that of an acceptor contained in GaN of the second semiconductor layer 2.

The source electrode 8 and the drain electrode 9 are provided on the opposite surface side of the first semiconductor layer 1 from the junction surface to the third semiconductor layer 3 via the fourth semiconductor layer 4 and the fifth semiconductor layer 5.

The gate electrode 7 is provided between the source electrode 8 and the drain electrode 9 on the opposite surface side of the first semiconductor layer 1 from the junction surface to the third semiconductor layer 3.

The source electrode 8 and the drain electrode 9 are, for example, metal electrodes. The metal electrode has, for example, a stacked structure of titanium (Ti) and aluminum (Al). The gate electrode 7 is, for example, a metal electrode. The gate electrode 7 is made of, for example, titanium nitride (TiN).

The first insulating layer 6 is provided between the first semiconductor layer 1 and the gate electrode 7. The first insulating layer 6 is made of, for example, silicon oxide, silicon nitride, silicon oxynitride, gallium oxide, aluminum oxide, aluminum oxynitride or the like. The first insulating layer 6 may cover a portion of the fourth semiconductor layer 4 and a portion of the fifth semiconductor layer 5 described below.

The fourth semiconductor layer 4 is provided between the source electrode 8 and the first semiconductor layer 1. The fourth semiconductor layer 4 is made of GaN or aluminum gallium nitride ($Al_xGa_{(1-x)}N$, $0<x\leq1$). Hereinafter, aluminum gallium nitride will be denoted as AlGaN.

The fifth semiconductor layer 5 is provided between the drain electrode 9 and the first semiconductor layer 1. The fifth semiconductor layer 5 is made of GaN or AlGaN. The fourth semiconductor layer 4 and the fifth semiconductor layer 5 are provided interposing the first insulating layer 6 and the gate electrode 7 on the first semiconductor layer 1.

The fourth semiconductor layer 4 and the fifth semiconductor layer 5 may contain donor type impurities.

When the nitride semiconductor device 100 is driven, a channel through which electrons run is formed in the first semiconductor layer 1 between the fourth semiconductor layer 4 and the fifth semiconductor layer 5. The fourth semiconductor layer 4 is a source region that supplies electrons to the channel. The fifth semiconductor layer 5 is a drain region that absorbs electrons of the channel.

If each of the fourth semiconductor layer 4 and the fifth semiconductor layer 5 is made of GaN, each of the fourth semiconductor layer 4 and the fifth semiconductor layer 5 is an n-type semiconductor. The density of donor type impurities contained in GaN per unit area is higher than an electron density of a two-dimensional electron layer forming a channel. The density of donor type impurities per unit area is adjusted by introducing silicon (Si) as an impurity.

If each of the fourth semiconductor layer 4 and the fifth semiconductor layer 5 is made of AlGaN, each of the fourth semiconductor layer 4 and the fifth semiconductor layer 5 may be an undoped layer or an n-type semiconductor. A two-dimensional electron layer is formed in each of the interface between the first semiconductor layer 1 and the fourth semiconductor layer 4 and the interface between the first semiconductor layer 1 and the fifth semiconductor layer 5.

The third semiconductor layer 3 is produced by crystal growth based on the metal organic chemical vapor deposition method (MOCVD method), the molecular beam epitaxial method (MBE method) or the like. Acceptor type impurities introducing into the third semiconductor layer 3 are transition metal elements such as Mg, Fe, and Cr. A thickness d of the third semiconductor layer 3 is thinner than that of the first semiconductor layer 1 and the second semiconductor layer 2. If, for example, the delta dope method capable of introducing an impurity into a 1-atom layer is used, the third semiconductor layer 3 can be formed as an extremely thin layer.

By treating the surface of the second semiconductor layer 2 using a gas containing a halogen group element such as fluorine and chlorine after producing the second semiconductor layer 2, the third semiconductor layer 3 containing an acceptor type impurity of a halogen group element such as fluorine and chlorine in the surface of the second semiconductor layer 2 can be produced. Particularly, diffusion of fluorine in a nitride semiconductor is small so that the thickness d of the third semiconductor layer 3 can be made thin.

The fourth semiconductor layer 4 and the fifth semiconductor layer 5 are selectively formed by the MOCVD method or the MBE method on the first semiconductor layer 1 across an area in which the first insulating layer 6 and the gate electrode 7 are formed. Alternatively, the fourth semiconductor layer 4 and the fifth semiconductor layer 5 may be formed by, after further forming a semiconductor layer on the first semiconductor layer 1, etching the semiconductor layer in an area in which the first insulating layer 6 and the gate electrode 7 are formed.

A substrate (not shown) may be provided on the surface opposite to the third semiconductor layer 3 side of the second semiconductor layer 2. Accordingly, the nitride semiconductor device 100 is fixed. If the substrate is made of a material different from GaN such as silicon (Si), silicon carbide (SiC), and sapphire ($Al_2O_3$), a nucleation layer or a buffer layer may be provided between the substrate and the second semiconductor layer 2.

If a positive gate voltage is applied to the gate electrode 7 in the nitride semiconductor device 100, a two-dimensional electron gas is generated in the interface between the first insulating layer 6 and the first semiconductor layer 1 to form a channel. The gate voltage when a two-dimensional electron gas is generated, that is, a threshold voltage is determined by the work function of a metal constituting the gate electrode 7, the dielectric constant of the first insulating layer 6, the thickness of the first insulating layer 6, the density of a donor or acceptor contained in the first semiconductor layer 1, and the surface potential of the first semiconductor layer 1. Thus, the threshold voltage of the nitride semiconductor device 100 can be set to a value enabling a desired normally-off operation by providing the third semiconductor layer 3 containing an acceptor type impurity to adjust the potential of the interface between the first semiconductor layer 1 and the first insulating film 6 to an appropriate value.

The thickness of the third semiconductor layer 3 is set such that a neutral region does not exist to prevent an increase of parasitic capacitance. The condition for non-existence of such a neutral region in the third semiconductor layer 3 can be estimated from the thickness d of the third semiconductor layer 3, an acceptor concentration $N_a$ per unit volume of the third semiconductor layer 3, a built-in potential $Vb_1$ between the first semiconductor layer 1 and the third semiconductor layer 3, and a built-in potential $Vb_2$ between the second semiconductor layer 2 and the third semiconductor layer 3.

If the concentration $N_a$ of the acceptor type impurity per unit volume of the third semiconductor layer 3 is sufficiently large, the Fermi level in thermal equilibrium of the third semiconductor layer 3 is positioned near the upper end of a valence band. On the other hand, the concentration of the acceptor type impurity of each of the first semiconductor layer 1 and the second semiconductor layer 2 is lower than the concentration of the acceptor type impurity of the third semiconductor layer 3. Thus, the Fermi level of each of the first semiconductor layer 1 and the second semiconductor layer 2 is closer to the lower end of a conduction band than that of the third semiconductor layer 3. Because an unintended donor or acceptor is contained in the first semiconductor layer 1 or the second semiconductor layer 2, the Fermi level of each of the first semiconductor layer 1 and the second semiconductor layer 2 may be positioned near the lower end of the conduction band, if donor is contained.

The built-in potential $V_{b_1}$ between the first semiconductor layer 1 and the third semiconductor layer 3 and the built-in potential $V_{b_2}$ between the second semiconductor layer 2 and the third semiconductor layer 3 are each maximally comparable to band gap energy $E_g$ of GaN. The width W of a depletion layer formed inside the third semiconductor layer 3 due to junction of the first semiconductor layer 1 and the third semiconductor layer 3 is given by $$W < [(2 \in E_g)/(qN_a)]^{1/2} \quad (1)$$

if $N_a$ is the concentration per unit volume of the acceptor type impurity in the third semiconductor layer, $E_g$ is the band gap energy of the nitride semiconductor of the third semiconductor layer, $\in$ is the permittivity of the nitride semiconductor of the third semiconductor layer and q is the elementary charge, respectively. Here, if the third semiconductor layer 3 is GaN, in general, 3.4 eV can be used for $E_g$, $8.0 \times 10^{-13}$ F/cm for $\in$, and $1.6 \times 10^{-19}$ C for q. The elementary charge is $1.602 \times 10^{-19}$ C. The value of $N_a$ can be obtained by various impurity analysis methods, for example, SIMS (Secondary Ion Mass Spectrometry). A similar width of a depletion layer can be assumed for the junction between the second semiconductor layer 2 and the third semiconductor layer 3 and so the condition for leaving no neutral region in the third semiconductor layer 3 is established as $$d < 2W \quad (2).$$

Therefore, as the condition for leaving no neutral region in the third semiconductor layer 3, the thickness d of the third semiconductor layer 3 needs to satisfy Formula (3).

$$0 < d < 2[(2 \in E_g)/(qN_a)]^{1/2} \quad (3)$$

It is evident from Formula (3) that the thickness d of the third semiconductor layer 3 decreases with an increasing concentration Na of the acceptor type impurity per unit volume of the third semiconductor layer 3.

To maintain the potential of the third semiconductor layer 3 at a stable large value, it is desirable to set $N_a$ as large as possible and to set d as small as possible within the range in which excellent crystal properties are retained and it is desirable to set d as small as possible. For example, if the concentration Na of the acceptor type impurity of the third semiconductor layer 3 is $10^{20}$ cm$^{-3}$, the thickness d of the third semiconductor layer 3 becomes less than 12 nm. Here, d is larger than 0 nm.

Figure 2A:
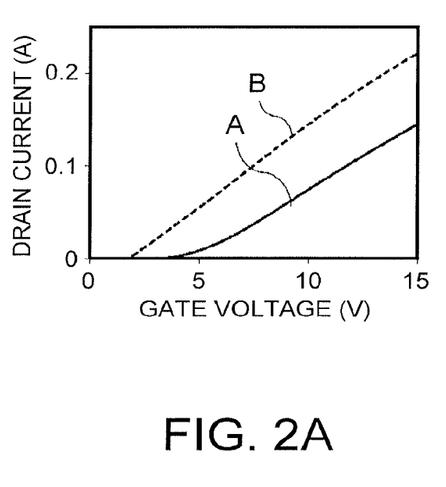
FIGS. 2A and 2B are diagrams showing effects of the nitride semiconductor device according to the first embodiment by simulation.
Figure 2B:
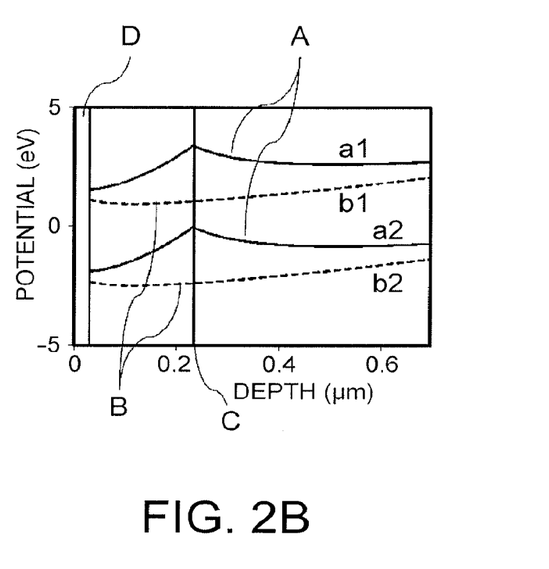

FIG. 2A shows the relation between the gate voltage and drain current of the nitride semiconductor device 100 and FIG. 2B shows potential distributions of the lower end of a conduction band and the upper end of a valence band in a direction from the gate electrode 7 toward the second semiconductor layer 2 of the nitride semiconductor device 100.

Each of FIGS. 2A and 2B is calculated by simulation. In FIG. 2A, both pieces of data for the nitride semiconductor device 100 (solid line A) and for a conventional nitride semiconductor device (broken line B) are shown. In FIG. 2B, both pieces of data for the nitride semiconductor device 100 (solid line A) and for a conventional nitride semiconductor device (broken line B) are shown. In FIG. 2B, a1 and b1 show potential distributions of the lower end of the conduction band, a2 and b2 show potential distributions of the upper end of the valence band, C shows the position of the third semiconductor layer 3, and D shows the position of the insulating layer 6.

In FIG. 2A, the threshold voltage of the nitride semiconductor device 100 is higher than that of a conventional nitride semiconductor device. This is because, as shown in FIG. 2B, the potential of the interface between the first semiconductor layer 1 and the first insulating layer 6 (surface potential of the first semiconductor layer 1) rises due to the existence of the third semiconductor layer 3.

Figure 3:
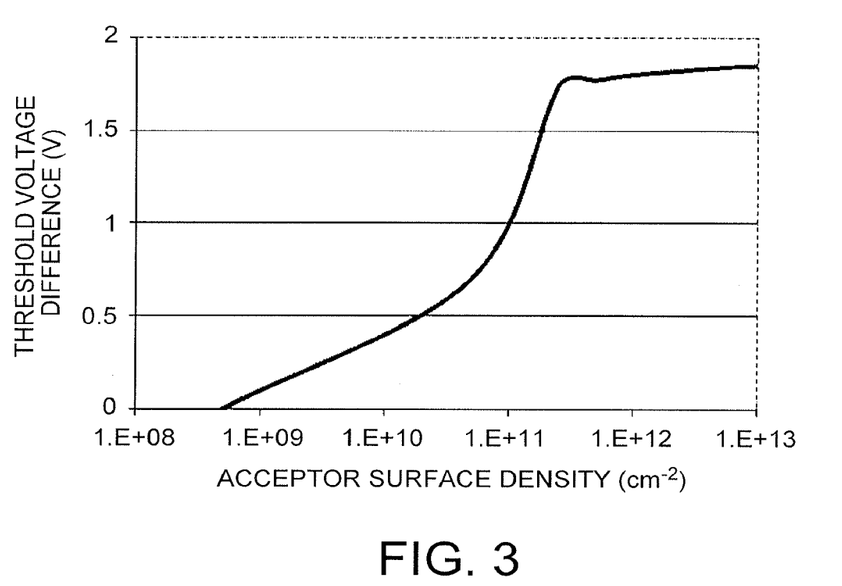
FIG. 3 is a diagram showing changes of a threshold voltage.

FIG. 3 shows a diagram of relation between the surface density of an acceptor type impurity of the third semiconductor layer 3 and a difference of the threshold voltage.

The surface density of an acceptor impurity is calculated by a product of the density per unit volume of the third semiconductor layer 3 and the thickness of the third semiconductor layer 3. The difference of the threshold voltage with respect to the surface density of the acceptor type impurity is the amount of change calculated by simulation using the threshold voltage in a conventional structure that does not contain the third semiconductor layer 3 as a reference value. The surface density (the unit is cm$^{-2}$) of the acceptor type impurity of the third semiconductor layer 3 is shown on the horizontal axis and a difference of the threshold voltage raised by providing the third semiconductor layer 3 is shown in the vertical axis.

When the surface density of the acceptor impurity is $5 \times 10^{11}$ cm$^{-2}$ or more, the potential of the interface between the first semiconductor layer 1 and the first insulating layer 6 is sufficiently high and so the threshold voltage of the nitride semiconductor device 100 could be raised.

Figure 4:
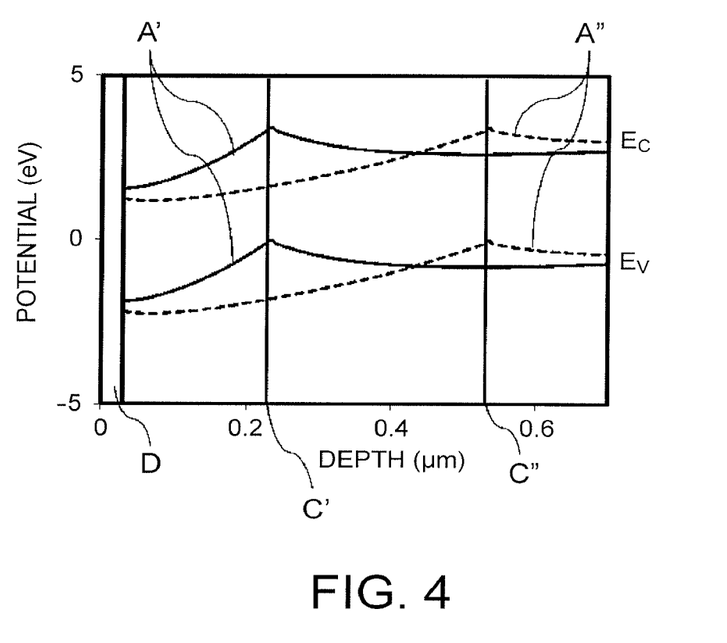
FIG. 4 is diagrams showing effects of the nitride semiconductor device according to the first embodiment by simulation.

FIG. 4 shows potential distributions of the lower end of conduction band and the upper end of the valence band in a direction from the gate electrode 7 toward the second semiconductor layer 2 when the depth where the third semiconductor layer 3 of the nitride semiconductor device 100 is formed, that is, the thickness of the first semiconductor layer 1 is different. In FIG. 4, A' (solid line) shows a case when the first semiconductor layer 1 is thin and A" (broken line) shows a case when the first semiconductor layer 1 is thick. C' shows the position of the third semiconductor layer 3 when the first semiconductor layer 1 is thin and C" shows the position of the third semiconductor layer 3 when the first semiconductor layer 1 is thick. The depth (μm) of the nitride semiconductor device 100 is shown on the horizontal axis, and potential energy (eV) of the lower end of conduction band and the upper end of the valence band with respect to electrons is shown on the vertical axis. When the thickness of the first semiconductor layer 1 is thin, the potential of the interface between the first semiconductor layer 1 and the first insulating layer 6 rises. Therefore, in this case, the threshold voltage rises.

Figure 5:
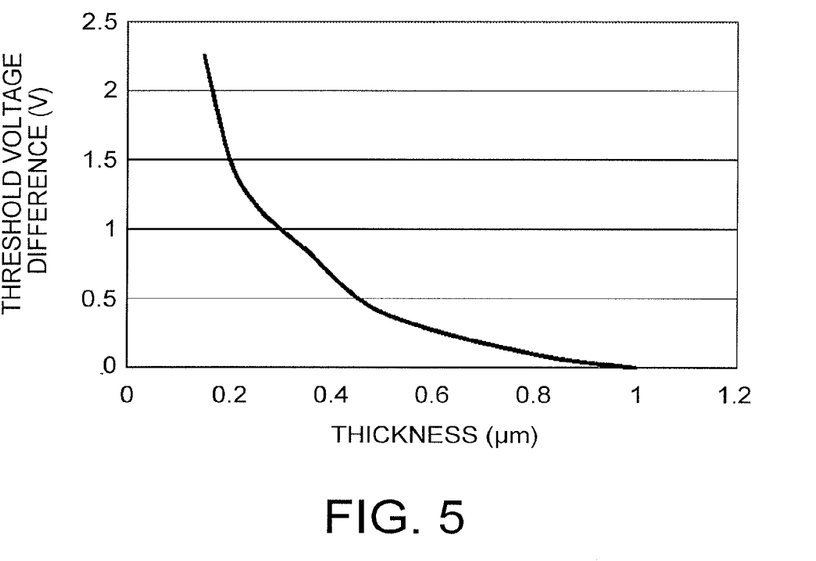
FIG. 5 is a diagram showing changes of the threshold voltage.

FIG. 5 shows a diagram of relation between the thickness of the first semiconductor layer 1 and the difference of threshold voltage.

The thickness (μm) of the first semiconductor layer 1 is shown on the horizontal axis and a difference (V) of the threshold voltage raised by providing the third semiconductor layer 3 is shown on the vertical axis. FIG. 5 is calculated by simulation.

When the thickness of the first semiconductor layer 1 is less than 1 μm, a normally-off type having a desired threshold voltage can be achieved by appropriately setting the thickness of the first semiconductor layer 1.

According to the nitride semiconductor device 100 in an embodiment, a nitride semiconductor device of a normally-off operation having a desired positive threshold voltage can be provided.

The nitride semiconductor device 100 described above includes the third semiconductor layer 3 of a nitride semiconductor between the first semiconductor layer 1 of a nitride semiconductor and the second semiconductor layer 2 of a nitride semiconductor, and having a higher concentration of the acceptor type impurity than that of each of the first semiconductor layer 1 and the second semiconductor layer 2. Accordingly, the potential of the interface between the first semiconductor layer 1 and the first insulating film 6 (surface potential of the first semiconductor layer 1) is adjusted so that a nitride semiconductor device of a normally-off operation having a desired positive threshold voltage can be provided. At this time, by setting the thickness d of the third semiconductor layer 3 to satisfy Formula (3), that is, $$0<d<2[(2\in E_g)/(qN_a)]^{1/2} \quad (3),$$

a neutral region can be prevented from being left in the third semiconductor layer 3 so that an increase of parasitic capacitance can be prevented. Therefore, a high-level switching speed can be obtained.

As shown in FIG. 3, the third semiconductor layer 3 preferably has the surface density of, for example, an acceptor type impurity of $5\times10^{11}$ cm$^{-2}$ or more. Accordingly, the potential of the interface between the first semiconductor layer 1 and the first insulating layer 6 is sufficiently high so that the threshold voltage of the nitride semiconductor device 100 can be raised.

As shown in FIG. 5, the length of the first semiconductor layer 1 in a direction from the second semiconductor layer 2 toward the third semiconductor layer 3 is preferably made, for example, longer than 0 μm and shorter than 1 μm.

Incidentally, the acceptor type impurity of the third semiconductor layer 3 may be any transition metal element or halogen group element. The results described above are common regardless of the kinds of impurities. Further, it is not limited to a single impurity introducing. Plural kinds of acceptor type impurities may be introduced into the third semiconductor layer 3.

GaN is used as nitride semiconductors of the first semiconductor layer 1, the second semiconductor layer 2, and the third semiconductor layer 3, but GaN, AlN, InN or a semiconductor having intermediate compositions thereof may also be used.

Undoped layers are used as the first semiconductor layer 1 and the second semiconductor layer 2, but these undoped layers may contain impurities or crystal defects unintended in manufacturing steps. Besides, the first semiconductor layer 1 and the second semiconductor layer 2 are not limited to undoped layers.

Nitride semiconductors can be used as the fourth semiconductor layer 4 and the fifth semiconductor layer 5. As the fourth semiconductor layer 4 and the fifth semiconductor layer 5, GaN, AlN, InN or a semiconductor having intermediate compositions thereof can be used. For example, GaN, Al$_x$Ga$_{(1-x)}$N (0<x≤1) or the like can be used. The fourth semiconductor layer 4 and the fifth semiconductor layer 5 may also be n-type layers containing a donor type impurity or undoped semiconductors.

Second Embodiment

Figure 6:
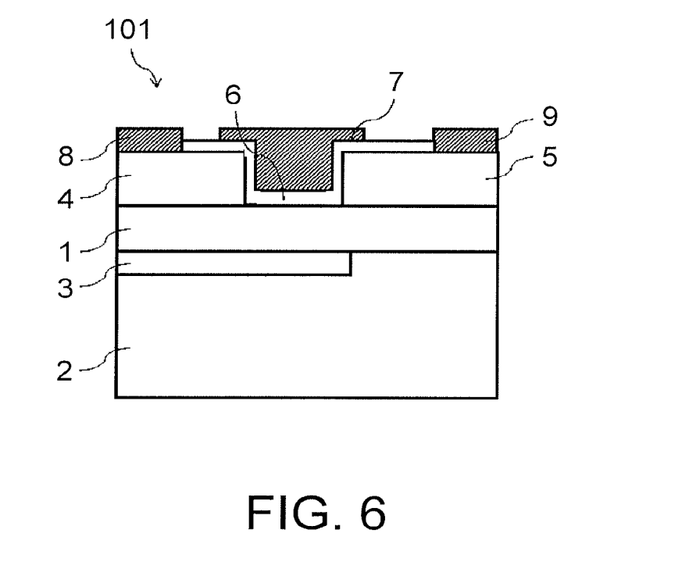
FIG. 6 is a schematic sectional view of a nitride semiconductor device according to a second embodiment.

FIG. 6 shows a nitride semiconductor device 101.

The same reference signs are attached to portions similar to those of the nitride semiconductor device 100 in FIG. 1 to omit the description thereof.

The third semiconductor layer 3 is positioned in each of between the source electrode 8 and the second semiconductor layer 2 and between the gate electrode 7 and the second semiconductor layer 2. In this case, the third semiconductor layer 3 is not provided between the drain electrode 9 and the second semiconductor layer 2. An area where the third semiconductor layer 3 is not provided may include, as shown in the figure, an area between a drain region 5 and the second semiconductor layer 2. When a high voltage is applied to the drain electrode 9, electric field strengths near the drain electrode 9 can be mitigated so that the nitride semiconductor device 101 has a high breakdown voltage.

To produce the third semiconductor layer 3 of the nitride semiconductor device 101, a mask is formed in advance on the area of the drain electrode 9 and the surface of the second semiconductor layer 2 between the gate electrode 7 and the drain electrode 9, and the surface of the second semiconductor layer 2 is treated using a gas containing a halogen group element so that the third semiconductor layer 3 containing an acceptor type impurity of the halogen group element such as fluorine, chlorine or the like can be produced in the surface of the second semiconductor layer 2.

Third Embodiment

Figure 7:
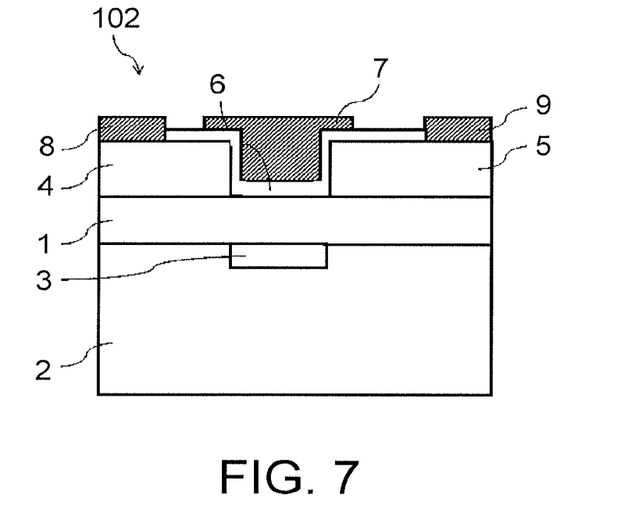
FIG. 7 is a schematic sectional view of a nitride semiconductor device according to a third embodiment.

FIG. 7 shows a nitride semiconductor device 102.

The same reference signs are attached to portions similar to those of the nitride semiconductor device 100 in FIG. 1 to omit the description thereof.

The third semiconductor layer 3 is provided between the first semiconductor layer 1 and the second semiconductor layer 2 and between the gate electrode 7 and the second semiconductor layer 2. The third semiconductor layer 3 is not provided between the source electrode 8 and the second semiconductor layer 2 and between the drain electrode 9 and the second semiconductor layer 2.

When a high voltage is applied to the drain electrode 9, electric field strengths near the drain electrode 9 can be mitigated so that, like the nitride semiconductor device 101, the nitride semiconductor device 102 has a high breakdown voltage.

Further, the nitride semiconductor device 102 has an electron density that rises more than that of the nitride semiconductor devices 100 and 101 in the first semiconductor layer 1 between the gate electrode 7 and the source electrode 8 so that the source resistance thereof decreases and also the on-resistance thereof decreases.

To produce the third semiconductor layer 3 of the nitride semiconductor device 102, a mask is formed in advance on the area of the drain electrode 9, the source electrode 8, the surface of the second semiconductor layer 2 between the gate electrode 7 and the drain electrode 9, and the surface of the second semiconductor layer 2 between the gate electrode 7 and the source electrode 8, and the surface of the second semiconductor layer 2 is treated using a gas containing a halogen group element so that the third semiconductor layer 3 containing an acceptor type impurity of the halogen group element such as fluorine, chlorine or the like can be produced in the surface of the second semiconductor layer 2.

Fourth Embodiment

Figure 8:
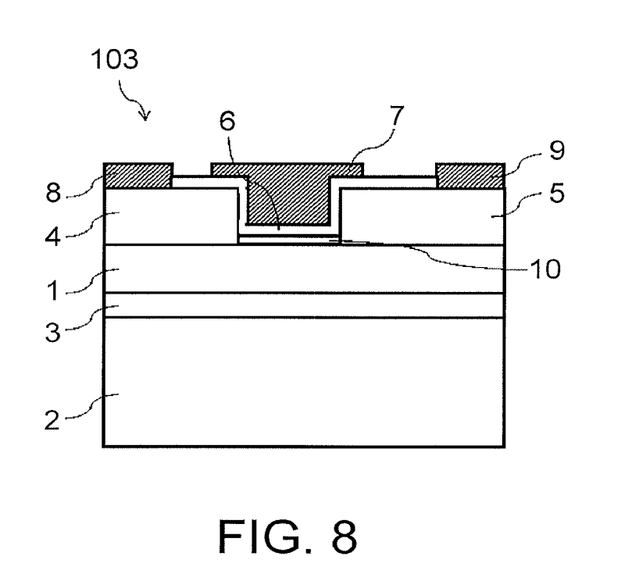
FIG. 8 is a schematic sectional view of a nitride semiconductor device according to a fourth embodiment.

FIG. 8 shows a nitride semiconductor device 103.

The same reference signs are attached to portions similar to those of the nitride semiconductor device 100 in FIG. 1 to omit the description thereof.

A layer 10 is provided between the first semiconductor layer 1 and the first insulating layer 6.

The layer 10 is either one of a sixth semiconductor layer or a second insulating layer.

If the layer 10 is the sixth semiconductor layer, the layer 10 is, for example, AlGaN or AlN (aluminum nitride).

If the layer 10 is the second insulating layer, the layer 10 is an oxide or oxynitride containing, for example, aluminum (Al) or gallium (Ga). The layer 10 may also be, for example, silicon nitride, silicon oxide, or silicon oxynitride. Also, the layer 10 may be an oxide or nitride containing hafnium (Hf).

The interface state between the first semiconductor layer 1 and the first insulating layer 6 can be decreased by providing the layer 10 and therefore, electron mobility can be improved. A similar effect can also be achieved by providing the sixth semiconductor layer or the second insulating layer in the nitride semiconductor devices 101, 102 described above.

Fifth Embodiment

Figure 9:
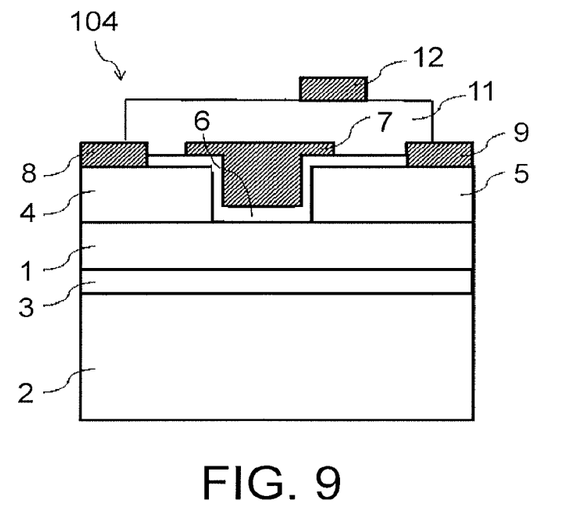
FIG. 9 is a schematic sectional view of a nitride semiconductor device according to a fifth embodiment.

FIG. 9 shows a nitride semiconductor device 104.

The same reference signs are attached to portions similar to those of the nitride semiconductor device 100 in FIG. 1 to omit the description thereof.

A third insulating layer 11 is provided in such a way that at least a portion between the gate electrode 7 and the drain electrode 9 is covered.

A first field plate 12 is provided on the third insulating layer 11. The first field plate 12 is provided in such a way that at least a portion thereof is positioned between the gate electrode 7 and the drain electrode 9 via the third insulating layer 11.

The first field plate 12 may be a metal as same as, for example, the gate electrode 7, the source electrode 8 and the drain electrode 9, or a different metal.

Electric field strengths of the gate electrode 7 on the drain electrode 9 side can be mitigated by providing the first field plate 12 so as to be positioned between the gate electrode 7 and the drain electrode 9 via the third insulating layer 11, thus the breakdown voltage of the nitride semiconductor device 104 can be improved. A similar effect can also be achieved by providing the first field plate 12 and the third insulating layer 11 in the nitride semiconductor devices 101, 102, 103 described above.

Sixth Embodiment

Figure 10:
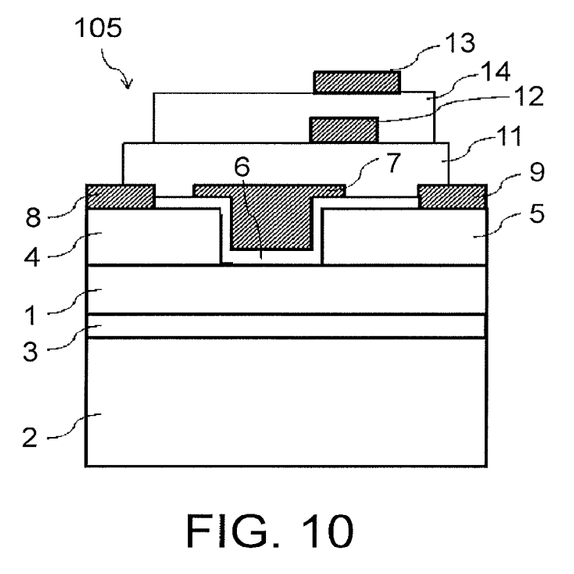
FIG. 10 is a schematic sectional view of a nitride semiconductor device according to a sixth embodiment.

FIG. 10 shows a nitride semiconductor device 105.

The same reference signs are attached to portions similar to those of the nitride semiconductor device 104 in FIG. 9 to omit the description thereof.

A fourth insulating layer 14 is provided in such a way that at least a portion of the third insulating layer 11 between the first field plate 12 and the drain electrode 9 is covered.

A second field plate 13 is provided on the fourth insulating layer 14. The second field plate 13 is provided in such a way that at least a portion thereof is positioned between the first field plate 12 and the drain electrode 9 via the fourth insulating layer 14 and the third insulating layer 11.

The second field plate 13 may be a metal as same as, for example, the gate electrode 7, the source electrode 8, the drain electrode 9 and the first field plate 12, or a different metal.

Because areas where a high electric field is achieved can be dispersed by providing the second field plate 13 via the fourth insulating layer 14, the breakdown voltage of the nitride semiconductor device 105 can be improved. A similar effect can also be achieved by providing the second field plate 13 and the fourth insulating layer 14 in the nitride semiconductor devices 101, 102, 103, 104 described above.

Some embodiments of the present invention have been described, but these embodiments are presented only by way of example and are not intended to limit the scope of the invention. The embodiments can also be carried out in various other forms and various omissions, substitutions, and alterations can be made without deviating from the spirit of the invention. The embodiments and modifications thereof are similarly included in the scope and spirits of the description and also included in the scope of inventions described in claims and equivalents thereof.

What is claimed is:

1. A nitride semiconductor device comprising:
a first semiconductor layer including a nitride semiconductor;
a second semiconductor layer including a nitride semiconductor;
a third semiconductor layer including a nitride semiconductor provided between the first semiconductor layer and the second semiconductor layer, the third semiconductor layer being contact with the first semiconductor layer and the second semiconductor layer, and a concentration of acceptor type impurity in the third semiconductor layer being higher than that in each of the first semiconductor layer and the second semiconductor layer;
a source electrode and a drain electrode provided on the opposite side of the first semiconductor layer from the third semiconductor layer;
agate electrode provided on the opposite side of the first semiconductor layer from the third semiconductor layer and provided between the source electrode and the drain electrode;
a first insulating layer provided between the gate electrode and the first semiconductor layer; and
a fourth semiconductor layer and a fifth semiconductor layer interposing the gate electrode therebetween, the fourth semiconductor layer is provided between the source electrode and the first semiconductor layer, the fifth semiconductor layer is provided between the drain electrode and the first semiconductor layer,
wherein the nitride semiconductor device satisfying the following formula $$0<d<2[(2\in E_g)/(qN_a)]^{1/2}$$

when d is thickness of the third semiconductor layer, Na is concentration per unit volume of the acceptor type impurity in the third semiconductor layer, Eg is band gap energy of the third semiconductor layer, $\in$ is permittivity of the third semiconductor layer and q is elementary charge.

2. The nitride semiconductor device according to claim 1, wherein the third semiconductor layer is positioned below at least between the source electrode and the drain electrode in a direction from the source electrode toward the drain electrode.

3. The nitride semiconductor device according to claim 1, wherein the third semiconductor layer contains at least one of transition metal elements and halogen group elements.

4. The nitride semiconductor device according to claim 1, wherein a surface density of the acceptor type impurity of the third semiconductor layer is $5 \times 10^{11}$ cm$^{-2}$ or more.

5. The nitride semiconductor device according to claim 1, wherein a length of the first semiconductor layer in a direction from the second semiconductor layer toward the third semiconductor layer is larger than 0 μm and smaller than 1 μm.

6. The nitride semiconductor device according to claim 1, wherein the first semiconductor layer is GaN.

7. The nitride semiconductor device according to claim 1, wherein the second semiconductor layer is GaN.

8. The nitride semiconductor device according to claim 1, wherein the third semiconductor layer is GaN.

9. The nitride semiconductor device according to claim 1, wherein each of the fourth semiconductor layer and the fifth semiconductor layer is a nitride semiconductor containing a donor type impurity.

10. The nitride semiconductor device according to claim 1, wherein each of the fourth semiconductor layer and the fifth semiconductor layer is one of $Al_xGa_{(1-x)}N$ (0<x≤1) and GaN.

11. The nitride semiconductor device according to claim 1, wherein the third semiconductor layer is positioned in each of between the source electrode and the second semiconductor layer and between the gate electrode and the second semiconductor layer.

12. The nitride semiconductor device according to claim 1, wherein the third semiconductor layer is positioned between the gate electrode and the second semiconductor layer.

13. The nitride semiconductor device according to claim 1, further comprising: a sixth semiconductor layer between the first semiconductor layer and the first insulating layer.

14. The nitride semiconductor device according to claim 13, wherein the sixth semiconductor layer is a nitride film containing at least one of Al and Ga.

15. The nitride semiconductor device according to claim 1, further comprising:
a second insulating layer between the first semiconductor layer and the first insulating layer.

16. The nitride semiconductor device according to claim 15, wherein the second insulating layer is one of a silicon oxide, a silicon nitride, a silicon oxynitride, an aluminum oxide, an aluminum nitride, an aluminum oxynitride, a gallium oxide, a gallium nitride, and a gallium oxynitride.

17. The nitride semiconductor device according to claim 1, further comprising:
a third insulating layer covering at least a portion between the gate electrode and the drain electrode; and
a first field plate on the third insulating layer.

18. The nitride semiconductor device according to claim 17, further comprising:
a fourth insulating layer covering at least a portion of the third insulating layer between the first field plate and the drain electrode; and
a second field plate on the fourth insulating layer.

* * * * *